(12) United States Patent
Cheng et al.

(10) Patent No.: US 11,798,875 B2
(45) Date of Patent: Oct. 24, 2023

(54) ELECTRONIC DEVICE AND MANUFACTURING METHOD THEREOF

(71) Applicant: InnoLux Corporation, Miao-Li County (TW)

(72) Inventors: Chung-Chun Cheng, Miao-Li County (TW); Kuang-Ming Fan, Miao-Li County (TW); Yao-Wen Hsu, Miao-Li County (TW)

(73) Assignee: INNOLUX CORPORATION, Miao-Li County (TW)

(*) Notice: Subject to any disclaimer, the term of this patent is extended or adjusted under 35 U.S.C. 154(b) by 0 days.

(21) Appl. No.: 17/535,167

(22) Filed: Nov. 24, 2021

(65) Prior Publication Data

US 2023/0119959 A1 Apr. 20, 2023

(30) Foreign Application Priority Data

Oct. 19, 2021 (CN) .......................... 202111216256.2

(51) Int. Cl.
| | |
|---|---|
| *H05K 1/11* | (2006.01) |
| *H05K 1/02* | (2006.01) |
| *H01L 23/498* | (2006.01) |
| *H01L 21/48* | (2006.01) |
| *H01L 23/00* | (2006.01) |

(52) U.S. Cl.
CPC .... *H01L 23/49838* (2013.01); *H01L 21/4857* (2013.01); *H01L 24/19* (2013.01); *H01L 24/20* (2013.01); *H05K 1/11* (2013.01); *H05K 1/111* (2013.01); *H01L 23/49822* (2013.01); *H01L 2224/19* (2013.01); *H01L 2224/214* (2013.01); *H05K 1/0268* (2013.01); *H05K 2201/0338* (2013.01); *H05K 2201/0347* (2013.01); *H05K 2201/09372* (2013.01)

(58) Field of Classification Search
CPC ........... H01L 23/49838; H01L 21/4857; H01L 24/19; H01L 24/20; H01L 23/49822; H01L 2224/19; H01L 2224/214
See application file for complete search history.

(56) References Cited

U.S. PATENT DOCUMENTS

| | | | | |
|---|---|---|---|---|
| 5,767,010 A | * | 6/1998 | Mis ...................... | H01L 21/2885 257/E23.021 |
| 6,015,505 A | * | 1/2000 | David ...................... | C23F 1/44 257/E21.309 |
| 6,759,599 B2 | * | 7/2004 | Tatoh ................ | H01L 23/49811 257/781 |
| 2015/0221605 A1 | * | 8/2015 | Atanasova ................ | C23F 1/26 257/737 |

(Continued)

FOREIGN PATENT DOCUMENTS

| | | |
|---|---|---|
| CN | 106328618 B | 12/2018 |
| TW | 200849428 A | 12/2008 |

*Primary Examiner* — Ishwarbhai B Patel
(74) *Attorney, Agent, or Firm* — MUNCY, GEISSLER, OLDS & LOWE, P.C.

(57) ABSTRACT

An electronic component includes: an insulating layer; and a first metal bump disposed on the insulating layer and provided with: a first metal layer disposed on the insulating layer; and a second metal layer disposed on the first metal layer, wherein, in a cross-sectional view of the electronic component, the first metal layer has a first width, the second metal layer has a second width, and the first width is smaller than the second width.

15 Claims, 10 Drawing Sheets

(56) References Cited

U.S. PATENT DOCUMENTS

2017/0005052 A1* 1/2017 Chen ................. H01L 23/49816
2021/0210420 A1* 7/2021 Chang ............... H01L 23/49811
2021/0305114 A1* 9/2021 Lee ........................ H01L 25/18

* cited by examiner

ELECTRONIC DEVICE AND MANUFACTURING METHOD THEREOF

CROSS REFERENCE TO RELATED APPLICATION

This application claims the benefits of the Chinese Patent Application Serial Number 202111216256.2, filed on Oct. 19, 2021, the subject matter of which is incorporated herein by reference.

BACKGROUND

1. Field of the Disclosure

The present disclosure relates to an electronic component and a manufacturing method thereof and, more particularly, to an electronic component facilitating electrical test and a manufacturing method thereof.

2. Description of Related Art

With the development of science and technology and in response to consumer demand, most of the current electronic products are developing towards a high degree of integration, that is, a single electronic device with multiple functions, and an electronic product with more functions requires a greater number of chips, so that the circuit I/O design becomes difficult. Generally, it is possible to change the original circuit I/O design or increase the spacing or number of I/O through a composite layer or a build-up structure, such as a re-distribution layer, so as to satisfy the requirements.

However, with the prior design, it is necessary to perform electrical tests on each re-distribution layer to facilitate subsequent manufacturing processes. Therefore, there is an urgent need to provide an electronic component and a manufacturing method thereof to facilitate electrical test or to avoid the damage of the electronic component caused during the electrical test.

SUMMARY

The present disclosure provides an electronic component, which includes: an insulating layer; and a first metal bump disposed on the insulating layer and provided with: a first metal layer disposed on the insulating layer; and a second metal layer disposed on the first metal layer, wherein, in a cross-sectional view of the electronic component, the first metal layer has a first width, the second metal layer has a second width, and the first width is smaller than the second width.

The present disclosure also provides a method for manufacturing electronic components, which includes the steps of: providing an insulating layer, wherein the insulating layer includes a first region and a second region, and a first metal layer and a second metal layer are sequentially disposed on the insulating layer, so that the first metal layer is disposed in the first region and the second region of the insulating layer, and the second metal layer is disposed on the first metal layer and corresponds to the first metal layer of the insulating layer; forming a mask on the first metal layer, wherein the mask corresponds to the second region of the insulating layer; removing part of the first metal layer disposed in the second region; removing the mask; and removing the first metal layer disposed in the second region so as to form an electronic component, wherein the electronic component includes: the insulating layer; and a first metal bump disposed on the insulating layer and provided with: the first metal layer disposed on the insulating layer; and the second metal layer disposed on the first metal layer, wherein, in a cross-sectional view of the electronic component, the first metal layer has a first width, the second metal layer has a second width, and the first width is smaller than the second width.

The present disclosure also provides a method for manufacturing electronic components, which includes the steps of: providing an insulating layer, wherein the insulating layer includes a first region and a second region, and a first metal layer and a second metal layer are sequentially disposed on the insulating layer, so that the first metal layer is disposed in the first region of the insulating layer, and the second metal layer is disposed on the first metal layer; forming a metal line in the second region of the insulating layer, wherein the metal line is electrically connected to the first metal layer; and removing the metal line to form an electronic component, wherein the electronic component includes: the insulating layer; and a first metal bump disposed on the insulating layer and provided with: the first metal layer disposed on the insulating layer; and the second metal layer disposed on the first metal layer.

From the following detailed description in conjunction with the accompanying drawings, other novel features of the present disclosure will become clearer.

DETAILED DESCRIPTION OF EMBODIMENT

Figure 1A:
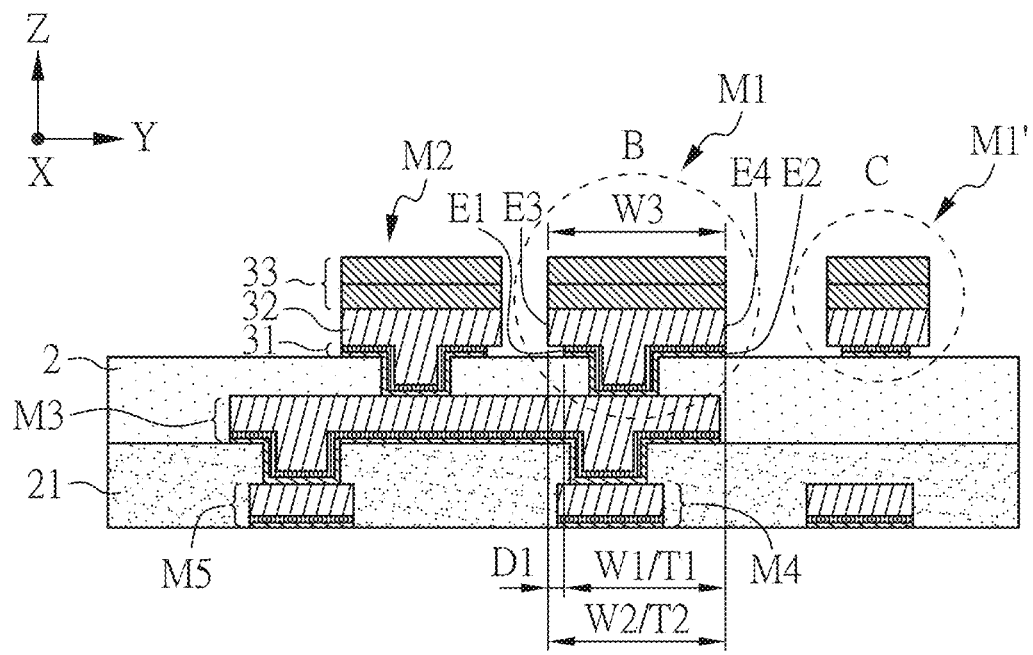
FIG. 1A is a cross-sectional view of an electronic component according to an embodiment of the present disclosure.

The following provides different embodiments of the present disclosure. These embodiments are used to illustrate the technical content of the present disclosure, rather than to limit the claims of the present disclosure. A feature of one embodiment can be applied to other embodiments through suitable modification, substitution, combination, and separation.

It should be noted that, in the specification and claims, unless otherwise specified, having "one" component is not limited to having a single said component, but one or more said components may be provided. In addition, in the specification and claims, unless otherwise specified, ordinal numbers, such as "first" and "second", used herein are intended to distinguish components rather than disclose explicitly or implicitly that names of the components bear the wording of the ordinal numbers. The ordinal numbers do not imply what order a component and another component are in terms of space, time or steps of a manufacturing method. A "first" component and a "second" component may appear together in the same component, or separately in different components. The existence of a component with a larger ordinal number does not necessarily mean the existence of another component with a smaller ordinal number.

In the entire specification and the appended claims of the present disclosure, certain words are used to refer to specific components. Those skilled in the art should understand that electronic device manufacturers may refer to the same components by different names. The present disclosure does not intend to distinguish those components with the same function but different names. In the claims and the following description, the words "comprise", "include" and "have" are open type language, and thus they should be interpreted as meaning "including but not limited to . . . ". Therefore, when the terms "comprise", "include" and/or "have" are used in the description of the present disclosure, they specify the existence of corresponding features, regions, steps, operations and/or components, but do not exclude the existence of one or more corresponding features, regions, steps, operations and/or components.

In the description, the terms "almost", "about", "approximately" or "substantially" usually means within 10%, 5%, 3%, 2%, 1% or 0.5% of a given value or range. The quantity given here is an approximate quantity; that is, without specifying "almost", "about", "approximately" or "substantially", it can still imply the meaning of "almost", "about", "approximately" or "substantially". In addition, the term "range of the first value to the second value" or "range between the first value and the second value" indicates that the range includes the first value, the second value, and other values in between.

Unless otherwise defined, all terms (including technical and scientific terms) used here have the same meanings as commonly understood by those skilled in the art of the present disclosure. It is understandable that these terms, such as those defined in commonly used dictionaries, should be interpreted as having a meaning consistent with the relevant technology and the background or context of the present disclosure, rather than in an idealized or excessively formal interpretation, unless specifically defined.

In addition, relative terms such as "below" or "bottom", and "above" or "top" may be used in the embodiments to describe the relationship between one component and another component in the drawing. It can be understood that, if the device in the drawing is turned upside down, the components described on the "lower" side will become the components on the "upper" side. When the corresponding member (such as a film or region) is described as "on another member", it may be directly on the other member, or there may be other members between the two members. On the other hand, when a member is described as "directly on another member", there is no member between the two members. In addition, when a member is described as "on another member", the two members have a vertical relationship in the top view direction, and this member may be above or below the other member, while the vertical relationship depends on the orientation of the device.

In the present disclosure, the thickness, length and width can be measured by using an optical microscope, and the thickness can be measured by the cross-sectional image in an electron microscope, but it is not limited thereto. In addition, there may be a certain error in any two values or directions used for comparison. If the first value is equal to the second value, it implies that there may be an error of about 10% between the first value and the second value. If the first direction is perpendicular to the second direction, the angle between the first direction and the second direction may be 80 to 100 degrees. If the first direction is parallel to the second direction, the angle between the first direction and the second direction may be 0 to 10 degrees.

It should be noted that the technical solutions provided by the different embodiments described hereinafter may be used interchangeably, combined or mixed to form another embodiment without violating the spirit of the present disclosure.

Figure 1B:
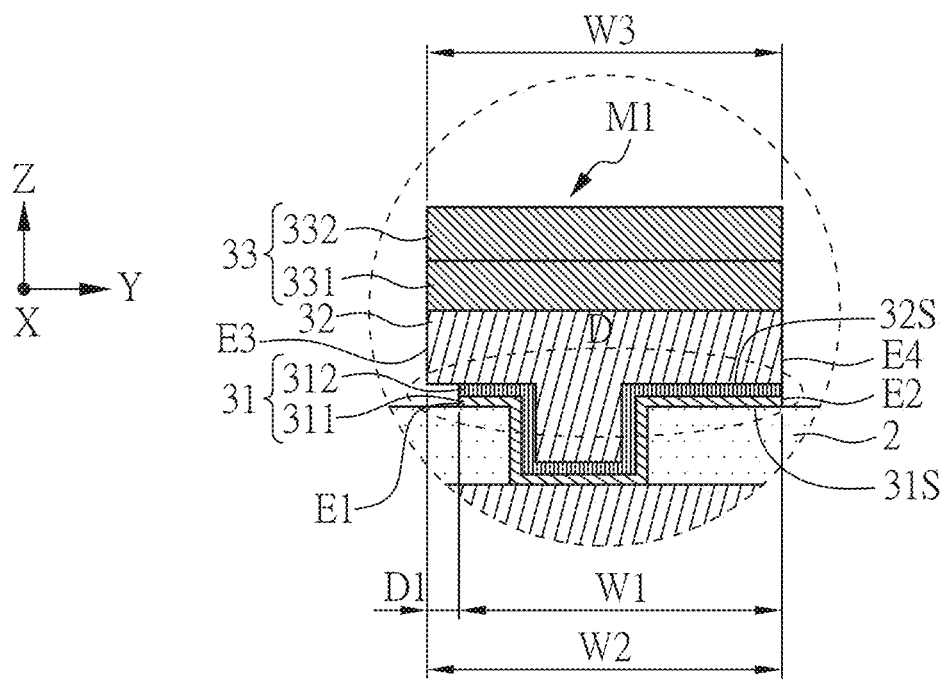
FIG. 1B and FIG. 1C are partial enlarged views of FIG. 1A.
Figure 1C:
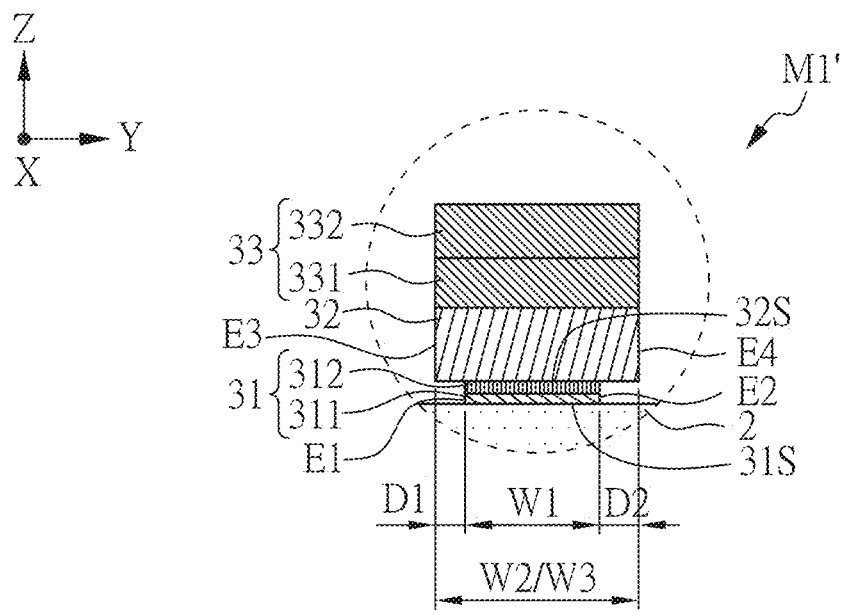

FIG. 1A is a cross-sectional view of an electronic component according to an embodiment of the present disclosure. FIG. 1B and FIG. 1C are partial enlarged views of FIG. 1A.

As shown in FIG. 1A and FIG. 1B, the electronic component of the present disclosure is characterized by comprising: an insulating layer 2; and a first metal bump M1 disposed on the insulating layer 2 and provided with: a first metal layer 31 disposed on the insulating layer 2; and a second metal layer 32 disposed on the first metal layer 31. In a cross-sectional view of the electronic component, the first metal layer 31 has a first width W1, and the second metal layer 32 has a second width W2, wherein the first width W1 is smaller than the second width W2.

In the present disclosure, the material of the insulating layer 2 is not particularly limited, and may be, for example, an organic material, an inorganic material, or a combination thereof. Examples of suitable organic materials may be polyimide (PI), photosensitive polyimide (PSPI), epoxy resin, polybenzoxazole (PBO), benzocyclobutene (ECB), photoresist, polymer, or a combination thereof, but the present disclosure is not limited thereto. Examples of suitable inorganic materials may be silicon nitride, silicon oxide, silicon oxynitride, silicon carbonitride, or a combination thereof, but the present disclosure is not limited thereto.

In the present disclosure, the materials of the first metal layer 31 and the second metal layer 32 are not particularly limited, and may be, for example, gold (Au), silver (Ag), copper (Cu), palladium (Pd), platinum (Pt), ruthenium (Ru), aluminum (Al), cobalt (Co), nickel (Ni), titanium (Ti), molybdenum (Mo), manganese (Mn), zinc (Zn), alloy thereof, or a combination thereof, but the present disclosure is not limited thereto. In addition, the same or different materials may be used to prepare the first metal layer 31 and the second metal layer 32. In one embodiment of the present disclosure, the first metal layer 31 may be a composite layer. More specifically, as shown in FIG. 1B, the first metal layer 31 may include a first sub-metal layer 311 and a second sub-metal layer 312, and the first sub-metal layer 311 is disposed between the second sub-metal layer 312 and the insulating layer 2, wherein the materials of the first sub-metal layer 311 and the second sub-metal layer 312 may be different. In one embodiment of the present disclosure, the first sub-metal layer 311 may include titanium, and the second sub-metal layer 312 may include copper. In one embodiment of the present disclosure, the second metal layer 32 may include copper.

In the present disclosure, the "first width" refers to the width of the bottom of the first metal layer 31 in the direction perpendicular to the normal direction Z of the insulating layer 2 in the cross-sectional view, that is, the width of the first metal layer 31 in the Y direction. The "first width" may also refer to the width of the surface 31S of the first metal layer 31 in contact with the insulating layer 2 in the direction perpendicular to the normal direction Z of the insulating layer 2, that is, the width of the surface 31S of the first metal layer 31 in contact with the insulating layer 2 in the Y direction. Alternatively, the "first width" may also refer to the distance between the two edges of the first metal layer 31. Similarly, in the present disclosure, the "second width" refers to the width of the bottom of the second metal layer 32 in the direction perpendicular to the normal direction Z of the insulating layer 2 in the cross-sectional view, that is, the width of the second metal layer 32 in the Y direction. The "second width" may also refer to the width of the surface 32S of the second metal layer 32 in contact with the first metal layer 31 in the direction perpendicular to the normal direction Z of the insulating layer 2 in the cross-sectional view, that is, the width of the surface 32S of the second metal layer 32 in contact with the first metal layer 31 in the Y direction. Alternatively, the "second width" may also refer to the distance between the two edges of the second metal layer 32. In one embodiment of the present disclosure, the ratio of the first width W1 to the second width W2 is smaller than or equal to 0.95 (W1/W2≤0.95).

In the present disclosure, the first metal bump M1 further includes a third metal layer 33 disposed on the second metal layer 32. The third metal layer 33 has a third width W3, and the first width W1 is smaller than the third width W3, wherein the material of the third metal layer 33 is similar to that of the first metal layer 31 or the second metal layer 32, and will not be repeated here. In one embodiment of the present disclosure, the third metal layer 33 may be a composite layer. More specifically, as shown in FIG. 1B, the third metal layer 33 may include a third sub-metal layer 331 and a fourth sub-metal layer 332. The third sub-metal layer 331 is disposed between the second metal layer 32 and the fourth sub-metal layer 332, wherein the materials of the third sub-metal layer 331 and the fourth sub-metal layer 332 may be the same or different. In one embodiment of the present disclosure, the third sub-metal layer 331 may include nickel, and the fourth sub-metal layer 332 may include gold, but the present disclosure is not limited thereto. Through the setting method of the present disclosure in which the second width W2 of the second metal layer 32 is greater than the first width W1 of the first metal layer 31 or the third width W3 of the third metal layer 33 is greater than the first width W1 of the first metal layer 31, the second metal layer 32 can be effectively stacked on the first metal layer 31 or the third metal layer 33 can be effectively stacked on the first metal layer 31, so as to improve the electrical characteristics of the electronic component, but the present disclosure is not limited thereto.

In the present disclosure, as shown in FIG. 1A, the first metal layer 31 has a first projection T1 on the insulating layer 2, and the second metal layer 32 has a second projection T2 on the insulating layer 2, wherein, in the normal direction Z of the insulating layer 2, the first projection T1 and the second projection T2 overlap with each other, and the area of the first projection T1 is smaller than the area of the second projection T2.

In addition, as shown in FIG. 1B, in the cross-sectional view, the first metal layer 31 has a first edge E1 and a second edge E2 opposite to the first edge E1, and the first edge E1 and the second edge E2 are disposed below the second metal layer 32. More specifically, the first metal layer 31 has a first edge E1 and a second edge E2 opposite to the first edge E1, and the second metal layer 32 has a third edge E3 and a fourth edge E4 opposite to the third edge E3, wherein, in the normal direction Z of the insulating layer 2, the first edge E1 may not overlap the third edge E3, and the second edge E2 may substantially overlap the fourth edge E4. In one embodiment of the present disclosure, the distance D1 between the first edge E1 and the third edge E3 may be greater than or equal to 0.1 micrometer (μm) and the distance between the second edge E2 and the fourth edge E4 may be smaller than 0.1 micrometer (μm).

FIG. 1C shows another first metal bump M1' of the present disclosure. FIG. 1C is similar to FIG. 1B except for the following differences.

As shown in FIG. 1C, the first metal layer 31 of the another first metal bump M1' has a first edge E1 and a second edge E2 opposite to the first edge E1, and the second metal layer 32 has a third edge E3 and a fourth edge E4 opposite to the third edge E3, wherein, in the normal direction Z of the insulating layer 2, the first edge E1 may not overlap the third edge E3, and the second edge E2 may not overlap the fourth edge E4. In one embodiment of the present disclosure, the distance D1 between the first edge E1 and the third edge E3 may be greater than or equal to 0.1 μm, the distance D2 between the second edge E2 and the fourth edge E4 may be greater than or equal to 0 μm, and the distance D1 between the first edge E1 and the third edge E3 and the distance D2 between the second edge E2 and the fourth edge E4 may be the same or different.

Figure 1D:
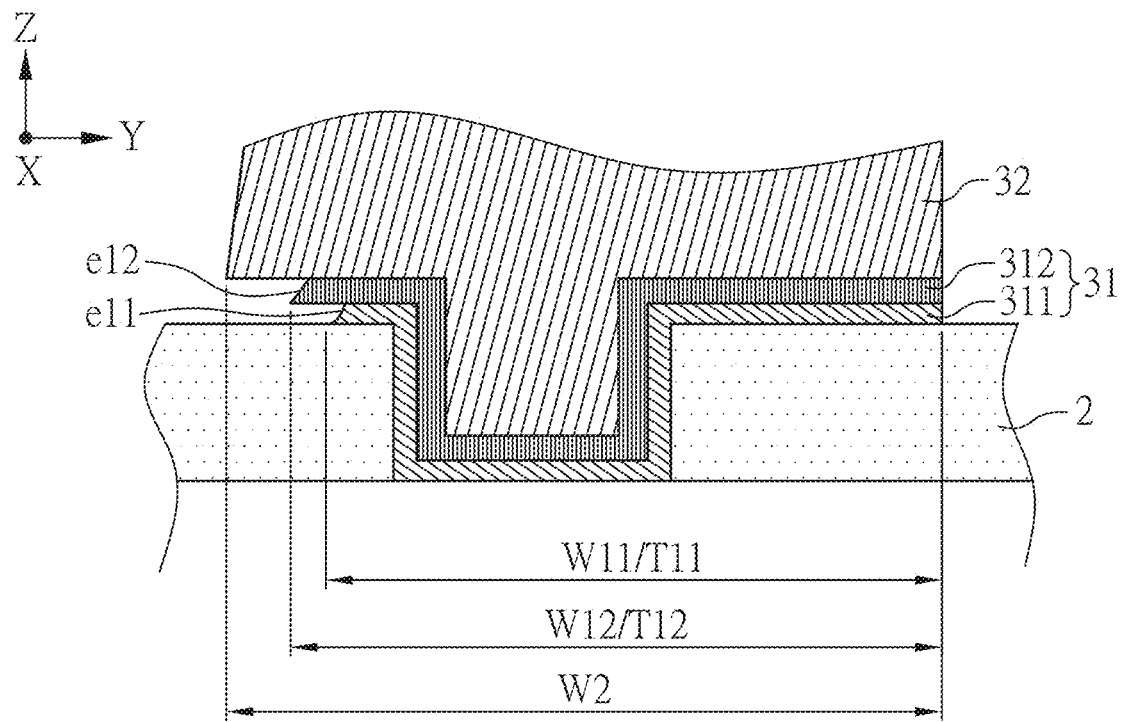
FIG. 1D is a partial enlarged view of FIG. 1B.

FIG. 1D is a partial enlarged view of FIG. 1B. As shown in FIG. 1D, in the present disclosure, the first metal layer 31 may include a first sub-metal layer 311 and a second sub-metal layer 312, and the width W11 of the first sub-metal layer 311 may be different from the width W12 of the second sub-metal layer 312. More specifically, in one embodiment of the present disclosure, the width W11 of the first sub-metal layer 311 may be smaller than the width W12 of the second sub-metal layer 312. Therefore, at least the distance between the edge e11 of the first sub-metal layer 311 and the edge e12 of the second sub-metal layer 312 may be greater than zero. In addition, in one embodiment of the present disclosure, the area of the projection T11 of the first sub-metal layer 311 on the insulating layer 2 may be smaller than the area of the projection T12 of the second sub-metal layer 312 on the insulating layer 2.

In the present disclosure, as shown in FIG. 1A, the electronic component may further include a second metal bump M2, and the second metal bump M2 is disposed on the insulating layer 2 and adjacent to the first metal bump M1. In the cross-sectional view, the first edge E1 and the second edge E2 of the first metal layer 31 are disposed below the second metal layer 32, the first edge E1 is closer to the second metal bump M2 than the second edge E2, and the third edge E3 of the second metal layer 32 is closer to the second metal bump M2 than the fourth edge E4, wherein the distance D1 between the first edge E1 and the third edge E3 is greater than the distance between the second edge E2 and the fourth edge E4. In this embodiment, as shown in FIG. 1A, the distance between the second edge E2 and the fourth edge E4 is substantially 0. However, in other embodiments of the present disclosure, as shown in FIG. 1C, the distance D2 between the second edge E2 and the fourth edge E4 may not be zero.

In the present disclosure, the electronic component may further include a third metal bump M3 disposed below the first metal bump M1 and the second metal bump M2; that is, the insulating layer 2 is disposed on the first metal bump M3 or between the second metal bump M2 and the third metal bump M3. The third metal bump M3 is electrically connected to the first metal bump M1 and the second metal bump M2, respectively. Therefore, the first metal bump M1 may be electrically connected to the second metal bump M2 through the third metal bump M3.

In addition, in the present disclosure, the electronic component may further include a plurality of metal bumps, such as a fourth metal bump M4 and a fifth metal bump M5 shown in FIG. 1A, but the present disclosure is not limited thereto. The fourth metal bump M4 and the fifth metal bump M5 are disposed below the third metal bump M3; that is, the third metal bump M3 is disposed between the insulating layer 2 and the fourth metal bump M4 and the fifth metal bump M5, and the fourth metal bump M4 and the fifth metal bump M5 are electrically connected to the third metal bump M3, respectively. In addition, another insulating layer 21 may be further included between the third metal bump M3 and the fourth metal bump M4 and the fifth metal bump M5, but the present disclosure is not limited thereto.

Figure 2:
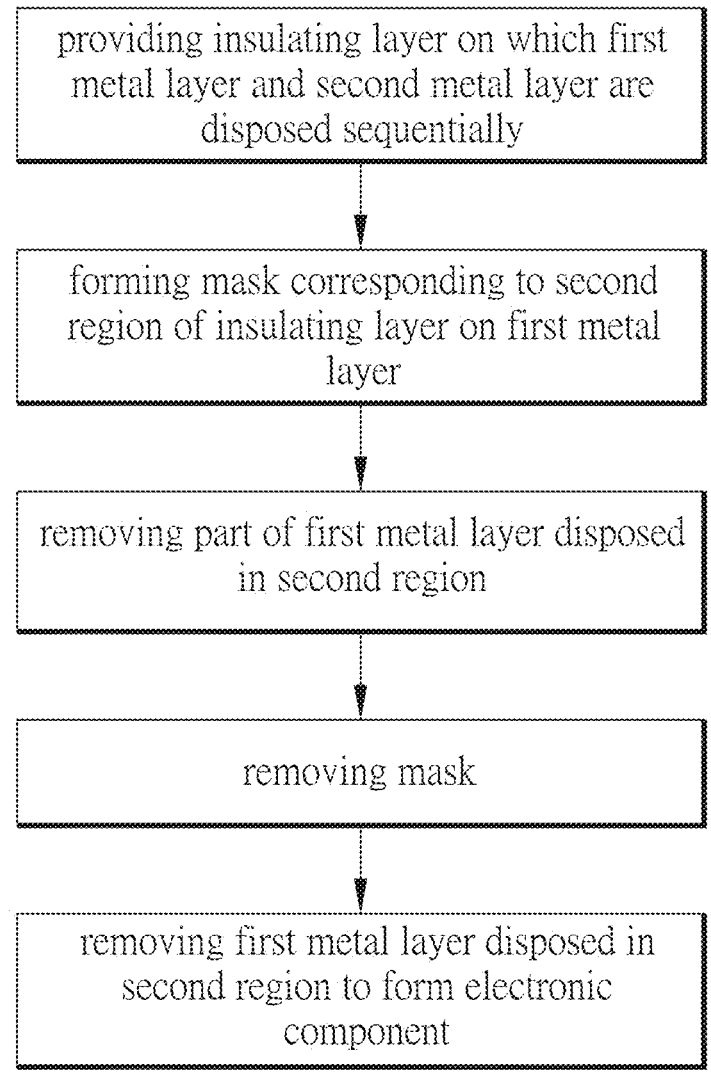
FIG. 2 is a block diagram illustrating the flow of the method for manufacturing electronic components according to an embodiment of the present disclosure.

FIG. 2 is a block diagram illustrating the flow of the method for manufacturing electronic components according to an embodiment of the present disclosure. FIG. 3A to FIG. 3F are cross-sectional views of an electronic component for illustrating the manufacturing process according to an embodiment of the present disclosure.

Figure 3A:
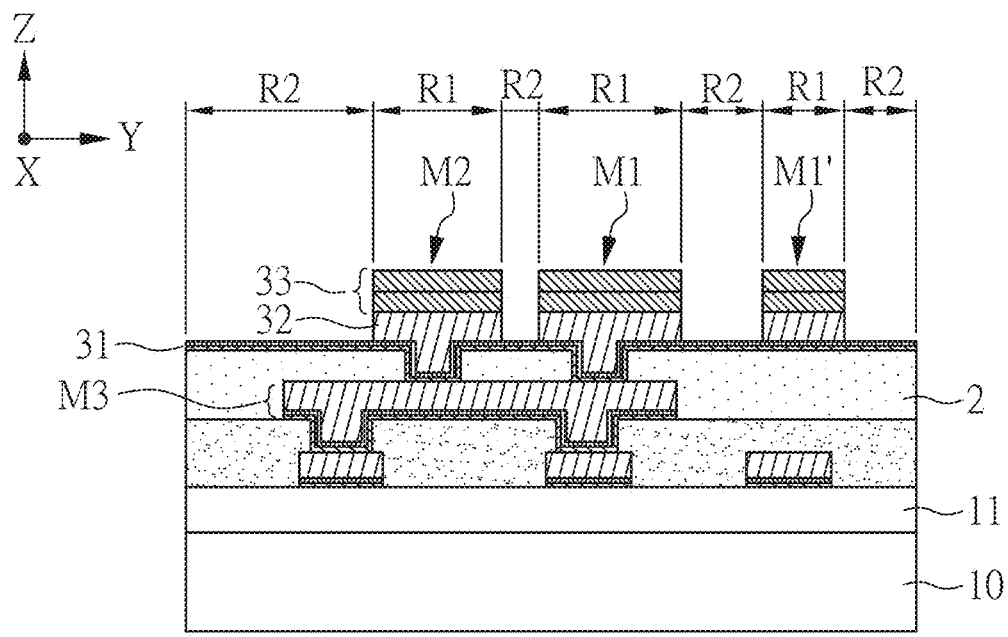
FIG. 3A to FIG. 3F are cross-sectional views of an electronic component for illustrating the manufacturing process according to an embodiment of the present disclosure.

As shown in FIG. 3A, there are provided a carrier substrate 10, and a release layer 11 disposed on the carrier substrate 10. Next, an insulating layer 2 is provided and disposed on the carrier substrate 10. The insulating layer 2 includes a first region R1 and a second region R2 and, on the insulating layer 2, it is sequentially provided with a first metal layer 31 disposed in the first region R1 and the second region R2 of the insulating layer 2; and a second metal layer 32 disposed on the first metal layer 31 and corresponding to the first region R1 of the insulating layer 2.

In the present disclosure, the "first region" refers to the region where the insulating layer 2 and the second metal layer 32 overlap with each other in the normal direction Z of the insulating layer 2, and the "second region" refers to a region where the insulating layer 2 and the second metal layer 32 do not overlap with each other in the normal direction Z of the insulating layer 2.

In one embodiment of the present disclosure, before the step of providing the insulating layer 2 disposed on the carrier substrate 10, it may further include providing a third metal bump M3 disposed on the carrier substrate 10, wherein the third metal bump M3 can be electrically connected to the first metal layer 31.

In the present disclosure, the material of the carrier substrate 10 is not particularly limited, and may be, for example, a quartz substrate, a glass substrate, a wafer, a sapphire substrate, a flexible and hard mixed board, a resin, an epoxy resin, or other rigid substrates. Alternatively, the carrier substrate 10 may also be a flexible substrate or a film, and its material may include polycarbonate (PC), polyimide (PI), polypropylene (PP), polyethylene terephthalate (PET), or other plastic materials. However, the present disclosure is not limited thereto. The release layer 11 may be an adhesive, an epoxy resin, a die attach film (DAF), or the like, but the present disclosure is not limited thereto. The release layer 11 may facilitate the subsequent step of removing the carrier substrate 10. In one embodiment of the present disclosure, the release layer 11 may not be present.

In the present disclosure, the method for forming the insulating layer 2 is not particularly limited, and may use, for example, dip coating, spin coating, roll coating, knife coating, spray coating, deposition, or a combination thereof, but the present disclosure is not limited thereto. The method for forming the first metal layer 31 and the second metal layer 32 is not particularly limited, and may use, for example, sputtering, electroplating, chemical plating, chemical vapor deposition and so on, or a combination thereof, but the present disclosure is not limited thereto. In addition, the same or different methods may be used to prepare the first metal layer 31 and the second metal layer 32, respectively.

As shown in FIG. 3A, a third metal layer 33 may be further formed on the second metal layer 32, and corresponds to the first region R1 of the insulating layer 2, wherein the third metal layer 33 may be prepared with a material or method similar to the first metal layer 31 or the second metal layer 32, and thus a detailed description is deemed unnecessary.

Figure 3B:
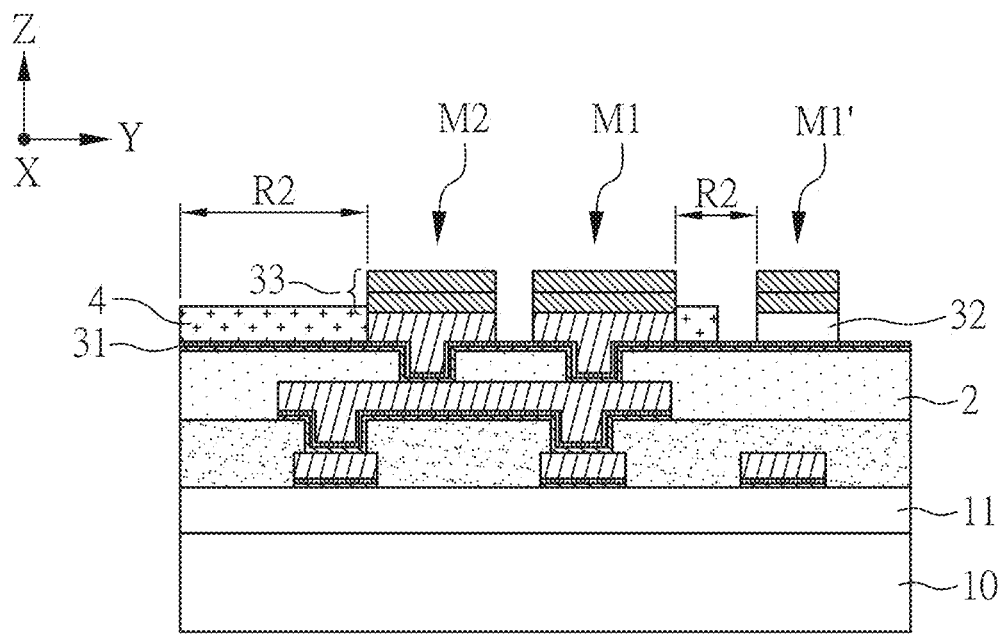

Next, as shown in FIG. 3B, a mask 4 is formed on the first metal layer 31, and the mask 4 corresponds to the second region R2 of the insulating layer 2, wherein the mask 4 can be patterned and formed on the first metal layer 31 by a photolithography process, an inkjet lithography process, or a combination thereof, so that the mask 4 is formed in the second region R2 corresponding to the insulating layer 2.

Figure 3C:
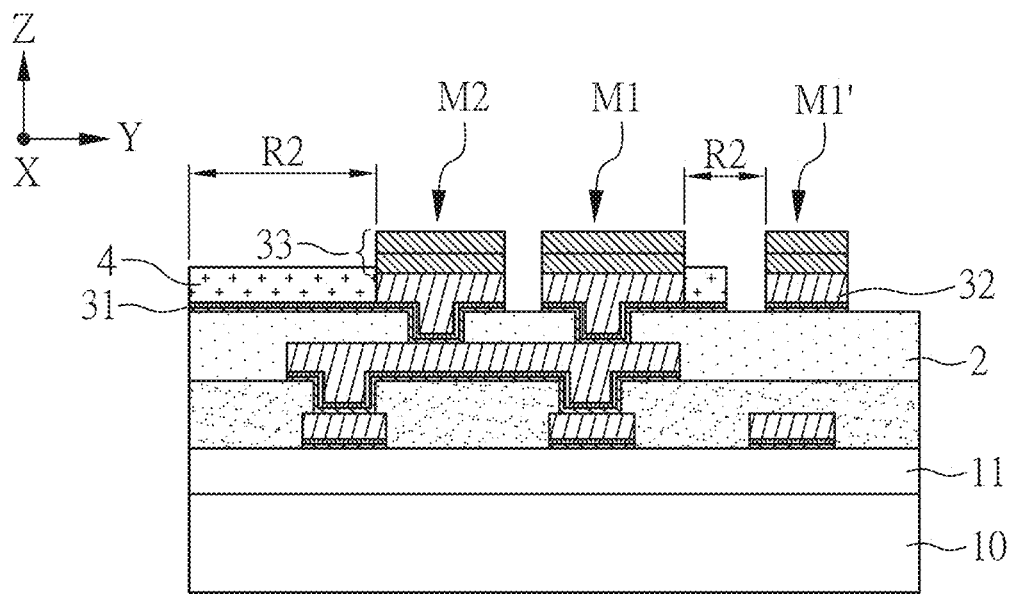
Figure 3D:
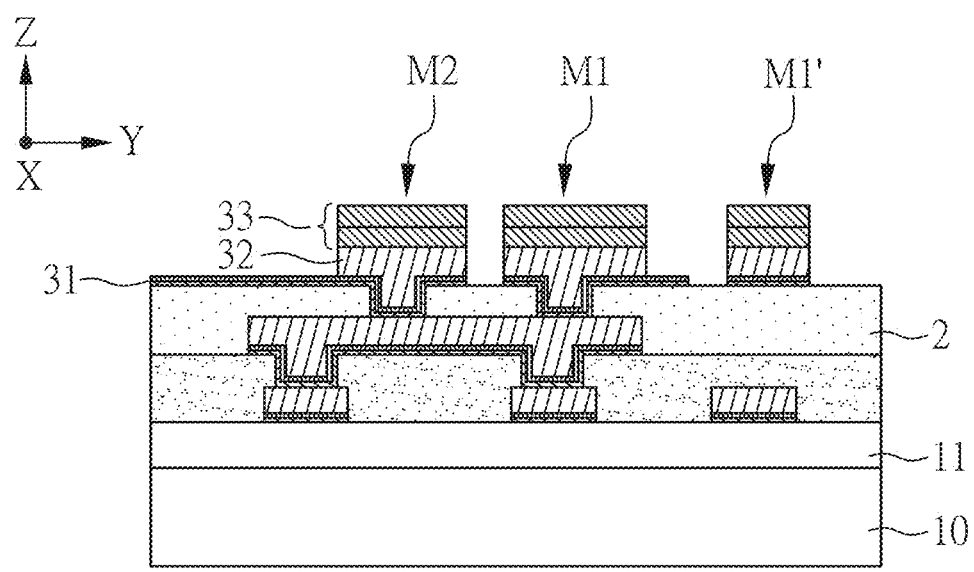

Then, as shown in FIG. 3C, part of the first metal layer 31 disposed in the second region R2 is removed. More specifically, in the second region R2, the first metal layer 31 not covered by the mask 4 is removed. Next, the mask 4 is removed to form a patterned first metal layer 31, as shown in FIG. 3D. Here, part of the first metal layer 31 may be removed by an etching method, and the etching method includes wet etching, dry etching, or a combination thereof, but the present disclosure is not limited thereto.

Figure 3E:
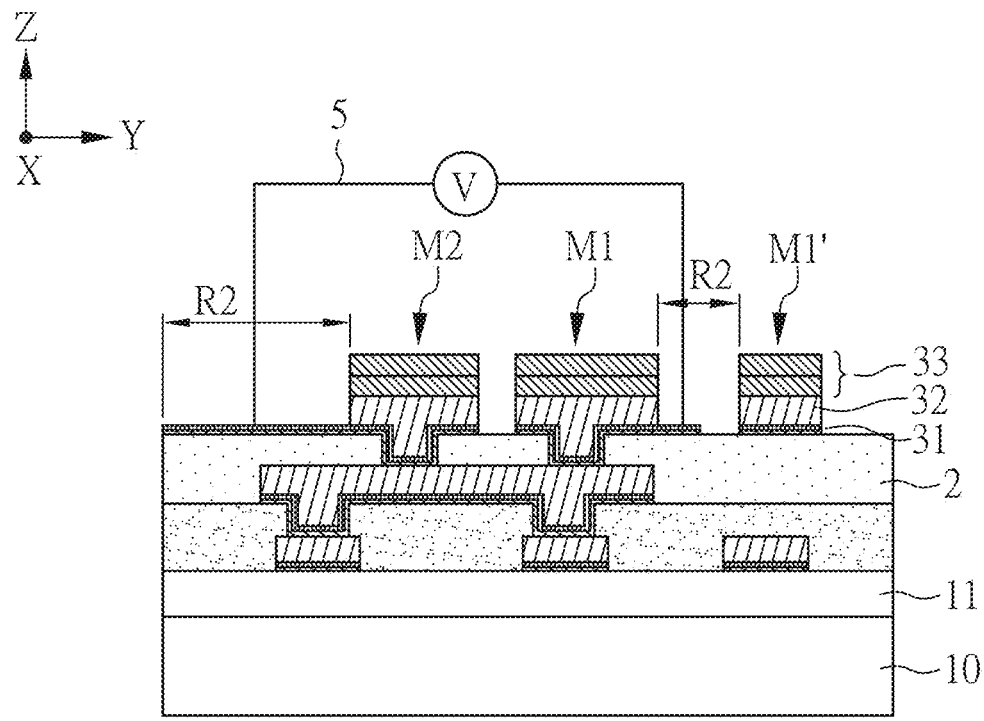

In order to ensure that the electrical characteristics of the electronic component are normal, an electrical test has to be performed on the electronic component. In the prior art, the test is performed directly on the metal bumps, which may cause damage to the metal bumps, and thus affect the performance of the electronic component or reduce the reliability of the electronic component. Therefore, in the present disclosure, as shown in FIG. 3E, the first metal layer 31 provided in the second region R2 of the insulating layer 2 may be used as an auxiliary circuit through which an electrical test instrument 5 is used to perform an electrical test on the electronic component, so as to prevent the metal bumps (for example, the first metal bump M1 and/or the second metal bump M2) from damage during the electrical test, thereby improving the performance or reliability of the electronic component, wherein the electrical test instrument 5 includes a voltmeter, a current meter, or a combination thereof, but the present disclosure is not limited thereto.

Figure 3F:
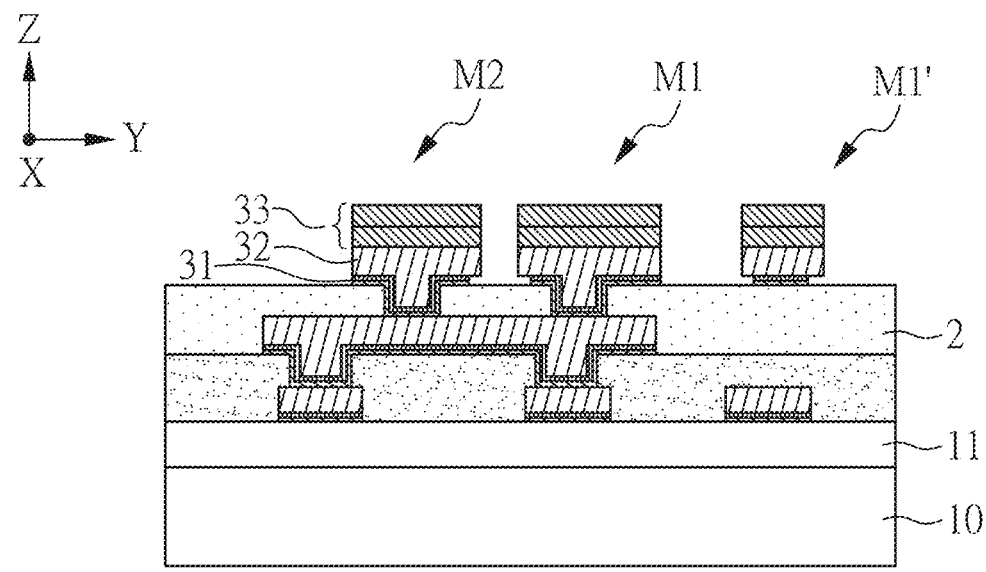

Next, as shown in FIG. 3F, the first metal layer 31 disposed in the second region R2 of the insulating layer 2 is removed to form the electronic component of the present disclosure, in which the electronic component of the present disclosure includes: an insulating layer 2; and a first metal bump M1 disposed on the insulating layer 2 and provided with: a first metal layer 31 disposed on the insulating layer 2; and a second metal layer 32, disposed on the first metal layer 31. In addition, in the present disclosure, a second metal bump M2 may be further provided above the insulating layer 2, and the second metal bump M2 is provided adjacent to the first metal bump M1, in which the third metal bump M3 may be electrically connected to the first metal bump M1 and the second metal bump M2, respectively. Therefore, the first metal bump M1 may be electrically connected to the second metal bump M2 through the third metal bump M3.

In addition, after the step of removing the first metal layer 31 disposed in the second region R2 of the insulating layer 2, it may further include a step of removing the carrier substrate 10 and the release layer 11 to form the electronic component as shown in FIG. 1A, and the electronic component may be applied in various electronic devices.

In the present disclosure, the first metal layer 31 provided in the second region R2 of the insulating layer 2 may be removed by an etching method, and the etching method includes wet etching, dry etching, or a combination thereof, but the present disclosure is not limited thereto. Since the first metal layer 31 is etched multiple times, as shown in FIG. 1B or FIG. 1C, the width of the first metal layer 31 is different from the width of the second metal layer 32 in the cross-sectional view of the electronic component. More specifically, the first metal layer 31 has a first width W1, the second metal layer 32 has a second width W2, and the first width W1 is smaller than the second width W2.

In addition, in the present disclosure, the electronic component may also be the one shown in FIG. 1D; that is, the first metal layer 31 may include a first sub-metal layer 311 and a second sub-metal layer 312, and the first sub-metal layer 311 is disposed between the second sub-metal layer 312 and the insulating layer 2, wherein the width W11 of the first sub-metal layer 311 may be smaller than the width W12 of the second sub-metal layer 312. In addition, as shown in FIG. 1B or 1C, the first metal bump M1 or the another first metal bump M1' may also include a third metal layer 33 disposed on the second metal layer 32 and corresponding to the first region R1 of the insulating layer 2, wherein the third metal layer 33 has a third width W3, and the first width W1 is smaller than the third width W3.

Figure 4:
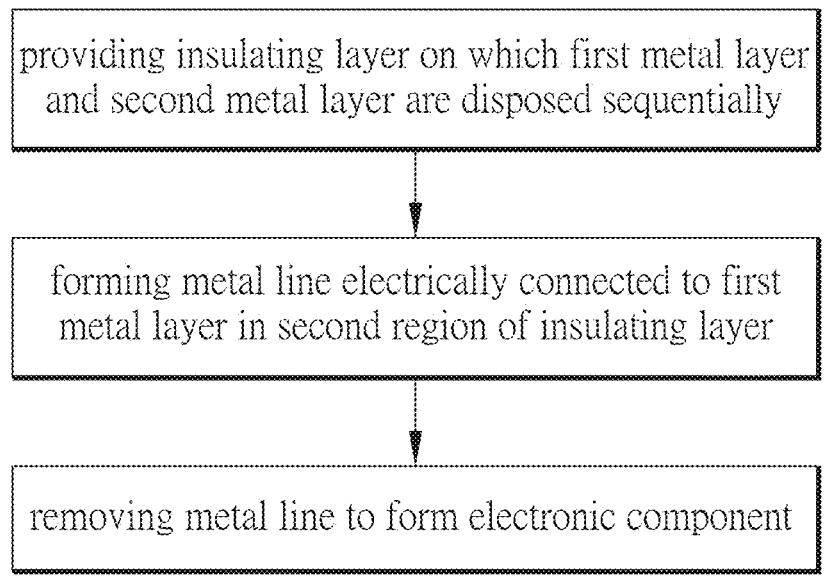
FIG. 4 is a block diagram illustrating the flow of a method for manufacturing electronic components according to an embodiment of the present disclosure.

FIG. 4 is a block diagram illustrating the flow of a method for manufacturing electronic components according to an embodiment of the present disclosure. FIG. 5A to FIG. 5D are cross-sectional views of an electronic component for illustrating the manufacturing process according to an embodiment of the present disclosure.

Figure 5A:
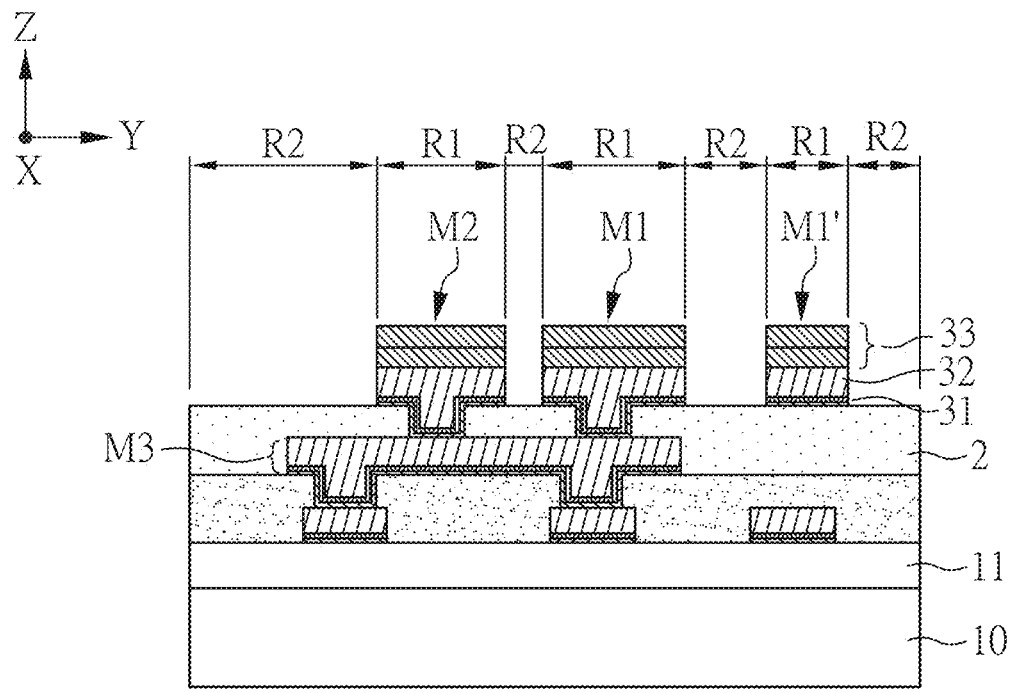
FIG. 5A to FIG. 5D are cross-sectional views of an electronic component for illustrating the manufacturing process according to an embodiment of the present disclosure.

As shown in FIG. 5A, there are provided a carrier substrate 10; and a release layer 11 disposed on the carrier substrate 10. Then, an insulating layer 2 is provided and disposed on the carrier substrate 10, wherein the insulating layer 2 includes a first region R1 and a second region R2 and, on the insulating layer 2, there are sequentially provided: a first metal layer 31 disposed in the first region R1 of the insulating layer 2; and a second metal layer 32 disposed on the first metal layer 31.

In the present disclosure, before the step of providing the insulating layer 2 disposed on the carrier substrate 10, it may further include providing a third metal bump M3 disposed on the carrier substrate 10, wherein the third metal bump M3 may be electrically connected to the first metal layer 31.

In the present disclosure, the materials of the carrier substrate 10, the release layer 11, the first metal layer 31, the second metal layer 32 and the insulating layer 2 are those as described above, and will not be repeated. In addition, the first metal layer 31, the second metal layer 32 and the insulating layer 2 may be prepared by using a method similar to the aforementioned method, and thus a detailed description is deemed unnecessary.

In the present disclosure, a third metal layer 33 may be further formed on the second metal layer 32, wherein the third metal layer 33 may be prepared with a material or method similar to the first metal layer 31 or the second metal layer 32, and thus a detailed description is deemed unnecessary.

Figure 5B:
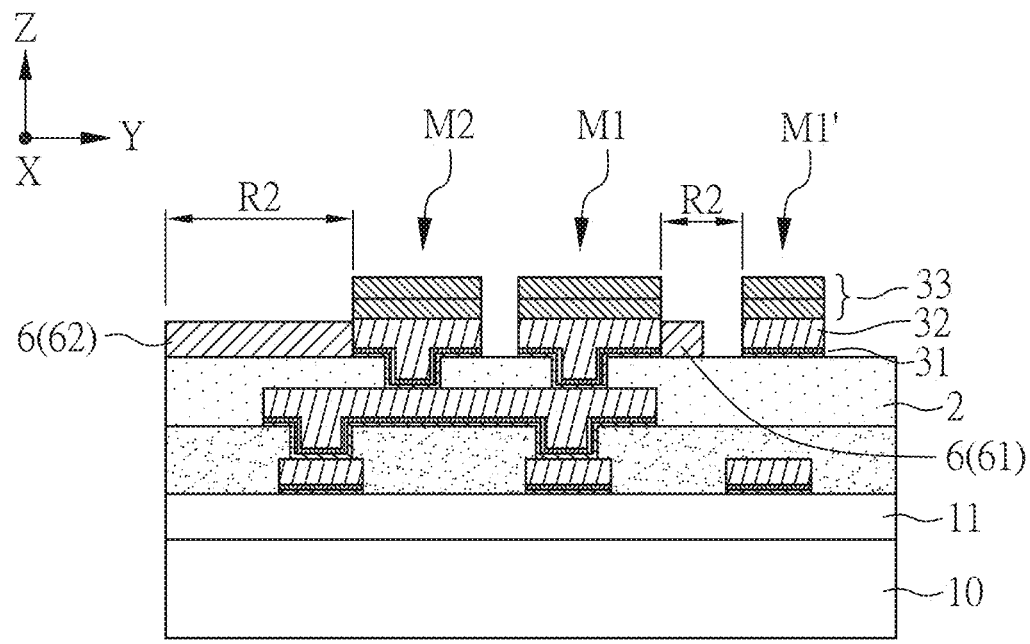

Then, as shown in FIG. 5B, a metal line 6 is formed in the second region R2 of the insulating layer 2, and the metal line 6 is electrically connected to the first metal layer 31. More specifically, the metal line 6 may include a first metal line segment 61 and a second metal line segment 62, wherein the first metal line segment 61 is electrically connected to the first metal layer 31 of the first metal bump M1, and the second metal line segment 62 is electrically connected to the first metal layer 31 of the second metal bump M2.

In the present disclosure, the material of the metal line 6 is not particularly limited, and may be, for example, gold, silver, copper, palladium, platinum, ruthenium, aluminum, cobalt, nickel, titanium, molybdenum, manganese, zinc, alloy thereof, or a combination thereof, but the present disclosure is not limited thereto. In addition, the metal line 6 may be formed by using a method such as printing, sputtering, electroplating, chemical vapor deposition, or a combination thereof, but the present disclosure is not limited thereto.

Figure 5C:
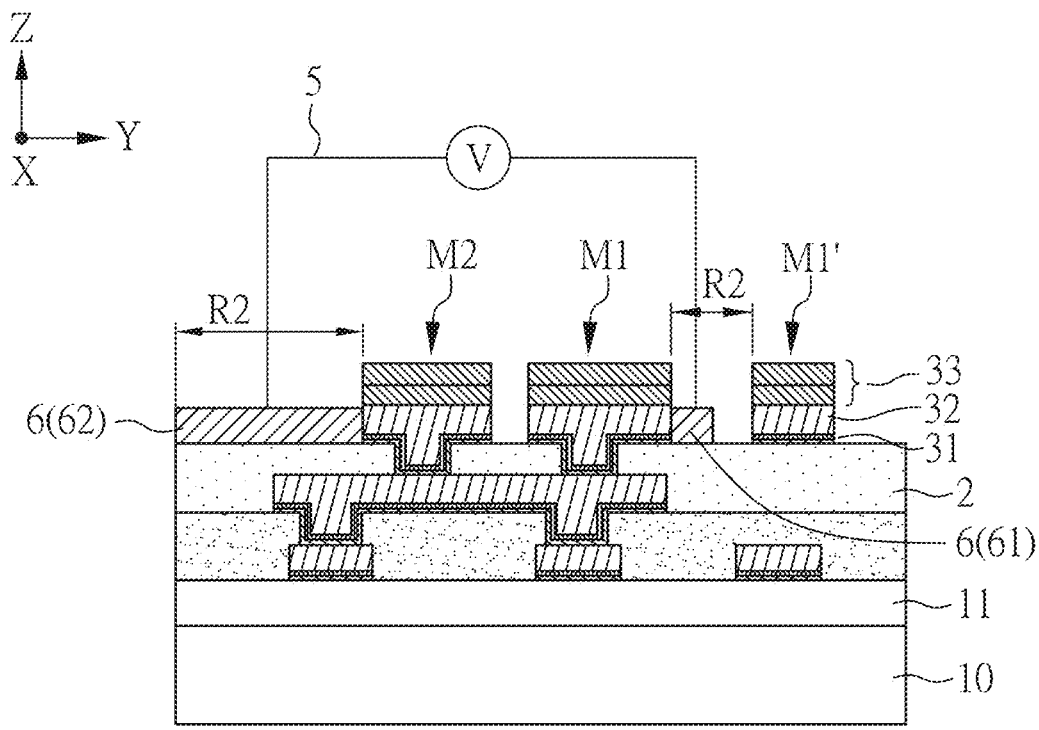

Next, as shown in FIG. 5C, the metal line 6 provided in the second region R2 of the insulating layer 2 may be used as an auxiliary circuit through which an electrical test instrument 5 is used to perform an electrical test on the electronic component, so as to prevent the metal bump (for example, the first metal bump M1 and/or the second metal bump M2) from damage during the electrical test, thereby improving the performance or reliability of the electronic component, wherein the electrical test instrument 5 includes a voltmeter, a current meter, or a combination thereof, but the present disclosure is not limited thereto.

Figure 5D:
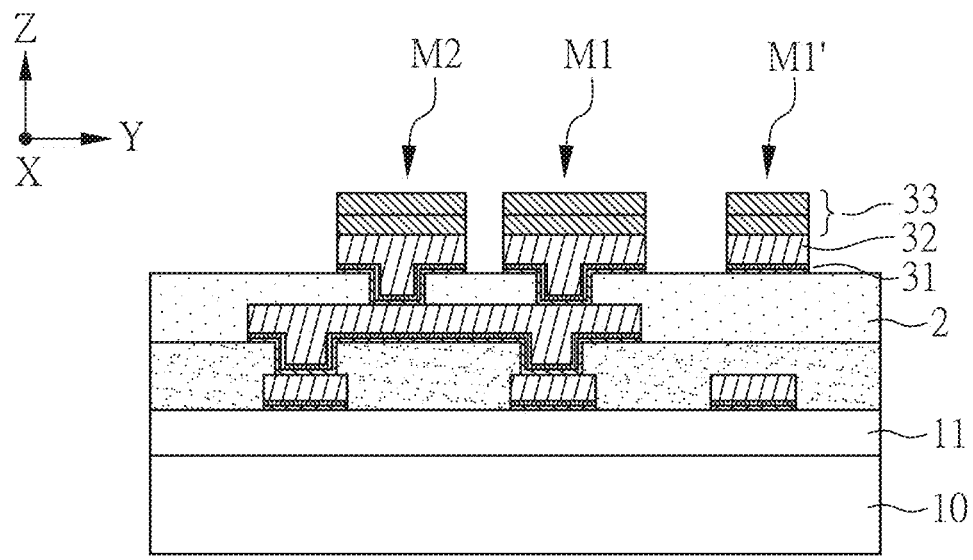

Then, as shown in FIG. 5D, the metal line 6 is removed to form another electronic component of the present disclosure, wherein the another electronic component of the present disclosure includes: an insulating layer 2; and a first metal bump M1 disposed on the insulating layer 2 and provided with: a first metal layer 31 disposed on the insulating layer 2; and a second metal layer 32 disposed on the first metal layer 31. In addition, in the present disclosure, a second metal bump M2 may be further provided above the insulating layer 2, and the second metal bump M2 is provided adjacent to the first metal bump M1, in which the third metal bump M3 may be electrically connected to the first metal bump M1 and the second metal bump M2, respectively. Therefore, the first metal bump M1 may be electrically connected to the second metal bump M2 through the third metal bump M3.

In addition, although not shown in the figure, after the step of removing the metal line 6, it may further include a step of removing the carrier substrate 10 and the release layer 11 so as to apply the electronic component to various electronic devices.

In the present disclosure, the metal line 6 may be removed by an etching method, and the etching method includes laser etching, wet etching, dry etching, or a combination thereof, but the present disclosure is not limited thereto. When the metal line 6 is removed by the laser etching method, part of the material of the metal line 6 may remain on the insulating layer 2. When the metal line 6 is removed by the wet etching method, an electronic component as shown in FIG. 1A may be obtained.

In summary, the present disclosure uses part of the first metal layer 31 or the metal line 6 as auxiliary circuits to be used for electrical testing to avoid the influence to the performance or reliability of the electronic component during the electrical test, thereby improving the performance or reliability of the electronic device.

In the present disclosure, the electronic component may include the re-distribution layer, the packaged component, such as Fan-Out Panel Level Package (FOPLP) components, Fan-Out Package on Package (FOPoP) components, and the 2.5D packaged component, but the present disclosure is not limited thereto. The electronic component of the present disclosure may be applied to various electronic devices, such as display devices, antenna devices, sensing devices, or tiled devices, but the present disclosure is not limited thereto.

The method for manufacturing electronic components disclosed in the present disclosure may be applied to the re-distribution layer (RDL) first process or the chip first process. The chip first process may be divided into a face up process or a face down process. The manufacturing method of the chip first process is similar to the manufacturing method shown in FIGS. 3A to 3F, except for the following differences.

Figure 6A:
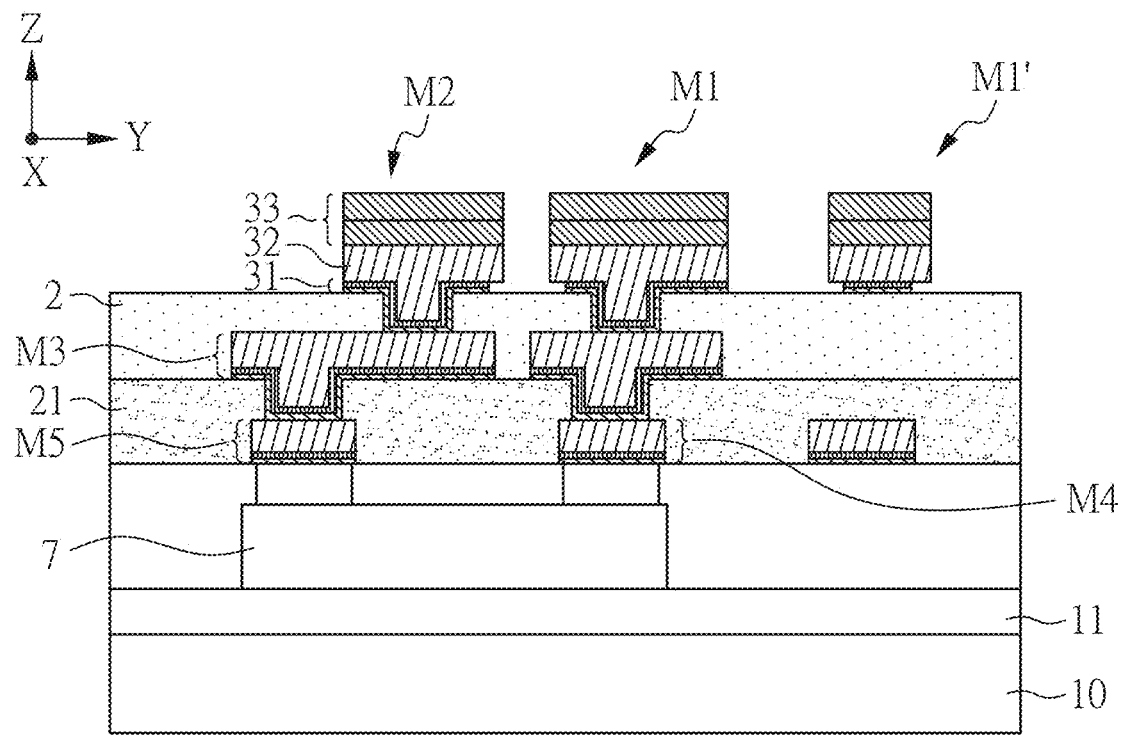
FIG. 6A and FIG. 6B are cross-sectional views of an electronic component according to an embodiment of the present disclosure.

In one embodiment of the present disclosure, for example, in a chip first process, as shown in FIG. 6A, after the carrier substrate 10 and the release layer 11 are provided, it may further include arranging a chip 7 on the carrier substrate 10, and then sequentially providing components such as the insulating layer 2, the first metal layer 31, and the second metal layer 32 on the carrier substrate 10, wherein the chip 7 may be electrically connected to the first metal layer 31 and the second metal layer 32. Afterwards, as shown in FIGS. 3B to 3E, after an electrical test is performed with part of the first metal layer 31 used as an auxiliary circuit, part of the first metal layer 31 is removed to form the structure shown in FIG. 6A. Then, the carrier substrate 10 and the release layer 11 are removed to form the electronic component of face up chip in this embodiment.

Figure 6B:
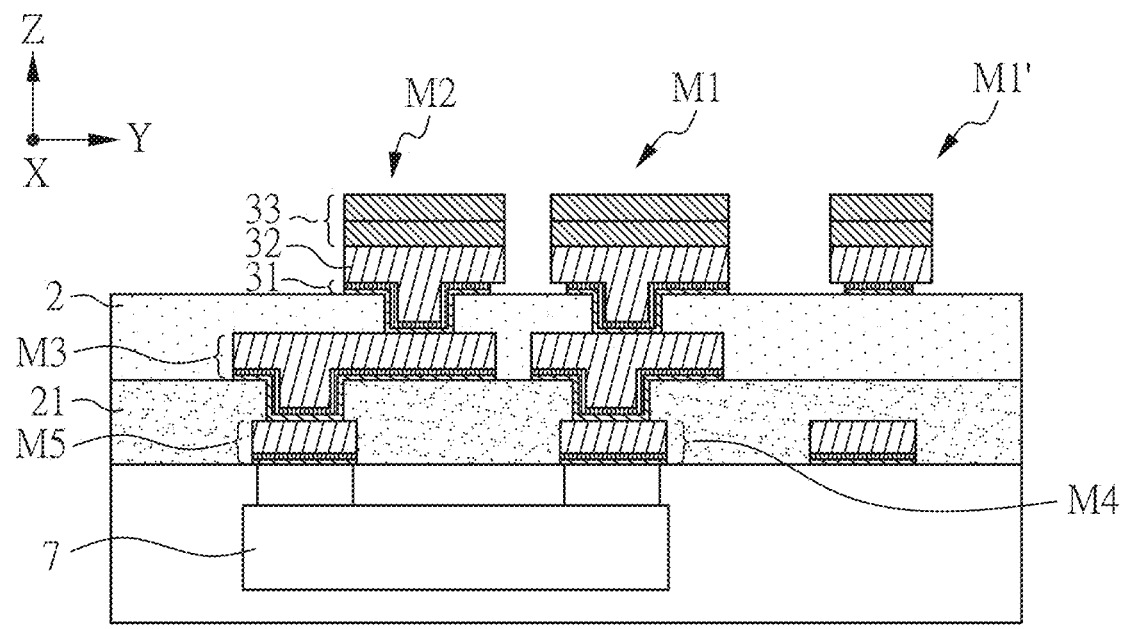

In addition, in another embodiment of the present disclosure, an electronic component of face down chip may be formed, as shown in FIG. 6B. The electronic component in FIG. 6B is similar to that in FIG. 6A except for the following differences.

In the manufacturing method of this embodiment, after providing the carrier substrate 10 and the release layer 11, the chip 7 is disposed on the carrier substrate 10, and then the carrier substrate 10 and the release layer 11 are removed. Then, components such as the insulating layer 2, the first metal layer 31 and the second metal layer 32 are sequentially provided on the chip 7, wherein the chip 7 may be electrically connected to the first metal layer 31 and the second metal layer 32. Afterwards, as shown in FIG. 3B to FIG. 3E, after the electrical test is performed with part of the first metal layer 31 used as an auxiliary circuit, part of the first metal layer 31 is removed to form the electronic component of face down chip in this embodiment, as shown in FIG. 6B.

In addition, although not shown in the figures, in other embodiments of the present disclosure, the manufacturing method shown in FIG. 5A to FIG. 5D may be used to perform the chip first process for using the metal line 6 as an auxiliary circuit to perform an electrical test, which will not be repeated.

The aforementioned specific embodiments should be construed as merely illustrative, and should not restrict the rest of the present disclosure in any way, while the features between different embodiments can be mixed and used as long as they do not conflict with each other.

What is claimed is:

1. An electronic component, comprising:
   an insulating layer; and
   a first metal bump disposed on the insulating layer and comprising:
      a first metal layer disposed on the insulating layer; and
      a second metal layer disposed on the first metal layer; and
   a second metal bump disposed on the insulating layer and adjacent to the first metal bump,
   wherein, in a cross-sectional view of the electronic component, the first metal layer has a first width, the second metal layer has a second width, and the first width is smaller than the second width;
   wherein, in the cross-sectional view, the first metal layer has a first edge and a second edge opposite to the first edge, the first edge and the second edge are disposed below the second metal layer, the first edge is closer to the second metal bump than the second edge, the second metal layer has a third edge and a fourth edge opposite to the third edge, the third edge is closer to the second metal bump than the fourth edge, and a distance between the first edge and the third edge is greater than a distance between the second edge and the fourth edge.

2. The electronic component of claim 1, wherein a ratio of the first width to the second width is smaller than or equal to 0.95.

3. The electronic component of claim 1, wherein the first metal bump further comprises a third metal layer disposed on the second metal layer, the third metal layer has a third width, and the first width is smaller than the third width.

4. The electronic component of claim 1, wherein the first metal layer comprises a first sub-metal layer and a second sub-metal layer, the first sub-metal layer is disposed between the second sub-metal layer and the insulating layer, and a width of the first sub-metal layer is smaller than a width of the second sub-metal layer.

5. The electronic component of claim 1, wherein the first metal layer has a first projection on the insulating layer, the second metal layer has a second projection on the insulating layer, and an area of the first projection is smaller than an area of the second projection.

6. The electronic component of claim 1, wherein in the cross-sectional view, the first edge and the third edge do not overlap with each other, and the second edge and the fourth edge substantially overlap with each other.

7. The electronic component of claim 6, wherein the distance between the first edge and the third edge is greater than or equal to 0.1 micrometer.

8. The electronic component of claim 1, wherein, in the cross-sectional view, the first edge and the third edge do not overlap with each other, and the second edge and the fourth edge do not overlap with each other.

9. The electronic component of claim 1, wherein the distance between the first edge and the third edge is greater than or equal to 0.1 micrometer, and the distance between the second edge and the fourth edge is greater than or equal to 0 micrometer.

10. The electronic component of claim 1, further comprising a third metal bump, wherein the insulating layer is disposed between the third metal bump and the first metal bump or the second metal bump.

11. The electronic component of claim 10, further comprising a fourth metal bump, a fifth metal bump and another insulating layer, wherein the another insulating layer is disposed between the third metal bump and the fourth metal bump and fifth metal bump, the third metal bump is disposed between the insulating layer and the another insulating layer, and the fourth metal bump and the fifth metal bump are respectively electrically connected to the third metal bump.

12. A manufacturing method of electronic component, comprising the steps of:
   providing an insulating layer including a first region and a second region, on which there are sequentially provided:

a first metal layer disposed in the first region and the second region of the insulating layer; and a second metal layer disposed on the first metal layer and corresponding to the first region of the insulating layer;

forming a mask on the first metal layer, wherein the mask corresponds to the second region of the insulating layer;

removing part of the first metal layer disposed in the second region;

removing the mask; and removing the first metal layer disposed in the second region to form an electronic component, wherein the electronic component includes: the insulating layer; a first metal bump disposed on the insulating layer; and a second metal bump disposed on the insulating layer and adjacent to the first metal bump, the first metal bump including:

the first metal layer disposed on the insulating layer; and the second metal layer disposed on the first metal layer;

wherein, in a cross-sectional view of the electronic component, the first metal layer has a first width, the second metal layer has a second width, and the first width is smaller than the second width;

wherein, in the cross-sectional view, the first metal layer has a first edge and a second edge opposite to the first edge, the first edge and the second edge are disposed below the second metal layer, the first edge is closer to the second metal bump than the second edge, the second metal layer has a third edge and a fourth edge opposite to the third edge, the third edge is closer to the second metal bump than the fourth edge, and a distance between the first edge and the third edge is greater than a distance between the second edge and the fourth edge.

13. The method of claim 12, wherein the first metal bump further comprises a third metal layer disposed on the second metal layer, and wherein, in the cross-sectional view, the third metal layer has a third width, and the first width is smaller than the third width.

14. The method of claim 12, wherein, in the cross-sectional view, the first region is an area where the insulating layer overlaps the second metal layer, and the second area is an area where the insulating layer does not overlap the second metal layer.

15. The method of claim 12, wherein, after the step of removing the mask, the first metal layer disposed in the second region of the insulating layer serves as an auxiliary circuit, by which an electrical test instrument is used to perform an electrical test on the electronic component.

\* \* \* \* \*